(12) United States Patent
Nakamura

(10) Patent No.: US 6,177,891 B1
(45) Date of Patent: Jan. 23, 2001

(54) SERIAL-PARALLEL CONVERSION APPARATUS

(75) Inventor: Kazuyuki Nakamura, Tokyo (JP)

(73) Assignee: NEC Corporation, Tokyo (JP)

( * ) Notice: Under 35 U.S.C. 154(b), the term of this patent shall be extended for 0 days.

(21) Appl. No.: 09/154,038

(22) Filed: Sep. 16, 1998

(30) Foreign Application Priority Data

Sep. 17, 1997 (JP) .................................................. 9-251215

(51) Int. Cl.$^7$ .................................................. H03M 9/00
(52) U.S. Cl. .................................................. 341/100
(58) Field of Search ............................................. 341/100

(56) References Cited

U.S. PATENT DOCUMENTS

| 5,128,673 | * | 7/1992 | Tamamura et al. | 341/100 |
| 5,808,571 | * | 9/1998 | Kuwata et al. | 341/100 |
| 6,018,305 | * | 1/2000 | Kikuchi et al. | 341/100 |

FOREIGN PATENT DOCUMENTS

| 3-26107 | 2/1991 | (JP) . |
| 3-172034 | 7/1991 | (JP) . |
| 9-55667 | 2/1997 | (JP) . |

\* cited by examiner

*Primary Examiner*—Trong Phan
(74) *Attorney, Agent, or Firm*—Sughrue, Mion, Zinn, Macpeak & Seas, PLLC

(57) ABSTRACT

The present invention provides a serial-parallel conversion apparatus comprises N conversion circuits, each having: a separator for dividing an input data from an upper node according to a clock signal from the upper node, into a plurality of data corresponding to a plurality of terminals; and a clock generator that divides by two the input clock signal and outputs a resultant clock as a clock signal to a lower node. These N conversion circuits are connected in a tree structure. Thus, each separator divides a data according to a clock supplied from an immediate upper node, and each clock generator divides by two the input clock signal. The resultant clock signal serves as a clock signal in a conversion circuit of a lower node. Accordingly, it is possible to minimize the signal line length for transmitting the clock signal. This enables to obtain an optimal clock signal timing.

20 Claims, 4 Drawing Sheets

(b)

(c)

SERIAL-PARALLEL CONVERSION APPARATUS

BACKGROUND OF THE INVENTION

1. Field of the Invention

The present invention relates to a serial-parallel conversion apparatus and in particular, to a data demultiplexer (DEMUX) circuit used in a serial-parallel conversion circuit for use in an optical communication system and a serial-parallel conversion circuit using the data demultiplexer circuit.

2. Description of the Related Art

FIG. 5a shows a tree-type serial to parallel conversion (demultiplexer) circuit used as a circuit for converting a parallel signal into a signal transmitted in serial in an optical communication or the like. This circuit includes an edge trigger type flip-flop (D-FF) (FIG. 5b) operating at a clock signal rise timing and a Master-Slave-Master type flip-flop (MSM-FF) (FIG. 5c) using three latch circuits to fetch a data at a clock signal trail timing and hold the data for one clock cycle starting at the next clock rise timing. This demultiplexer circuit divides a signal by two at each stage so as to reduce the frequency to half.

That is, at stage S1 shown in FIG. 5a, a data (Data in) is supplied as a D input to an MSM-FF 10-11 and a D-FF 11-11 and a reverse Q output of the D-FF 12-1 is supplied as a D input to a D-FF 12-1 for dividing a clock signal CLK. The clock signal CLK (2 GHz) is inputted directly to the MSM-FF 10-11 and to the D-FF 11-11.

Moreover, at stage S2 in FIG. 5a, the Q output from the MSM-FF 10-11 is supplied as the D input to an MSM-FF 10-21 and a D-FF 11-21; the Q output from the D-FF 11-11 is supplied as the D input to an MSM-FF 10-22 and a D-FF 11-22; and the Q output from the D-FF 12-1 is divided by a D-FF 12-2.

The clock signal CLK which has been divided by the D-FF 12-1 is supplied as a clock signal (1 GHz) to the MSM-FF 10-21, the D-FF 11-21, the MSM-FF 10-22, and the D-FF 11-22.

Furthermore, at stage S3 in FIG. 5A, the Q output from the MSM-FF 10-21 is supplied as the D input to an MSM-FF 10-31 and a D-FF 11-31; the Q output from the D-FF 11-21 is supplied as the D input to an MSM-FF 10-32 and a D-FF 11-32; the Q output from the MSM-FF 10-22 is supplied as the D input to an MSM-FF 10-33 and a D-FF 11-33; and the Q output from the D-FF 11-22 is supplied as the D input to an MSM-FF 10-34 and a D-FF 11-34.

The clock signal (1 GHz) is further divided by the D-FF 12-2, and a resultant clock signal (500 MHz) is supplied to each of the MSM-FF 10-31 to 10-34 and each of the D-FF 11-31 to 11-34. It should be noted that the clock signal (500 MHz) obtained as a result of dividing by the D-FF 12-2 is outputted together with 8-bit parallel data D0 to D7 which are outputted from the MSM-FF 10-31 to 10-34 and the D-FF 11-31 to 11-34, respectively.

The tree-type serial-parallel conversion circuit shown in FIG. 5 has a problem that the circuit size becomes greater than a typical shift-register-type demultiplexer circuit. Moreover, there is a problem that it is impossible to correlate a serial input signal to an output signal. For example, it is impossible to know a signal of which timing is outputted from the terminal D0. In spite of these problems, there is an advantage that the necessary clock frequency is sufficient to be half of the input signal cycle. (For example, for a 4 Gbps data signal, a clock of 2 GHz is sufficient.) Accordingly, the tree-type serial-parallel conversion circuit is now widely used as a high-speed demultiplexer circuit of CMOS (complementary metal oxide semiconductor).

It should be noted that the MSM-FF is constituted by three latch circuits connected in series. A clock signal is directly inputted to a first stage latch circuit and to a third stage latch circuit, whereas the clock signal is reversed when supplied to a second stage latch circuit.

The circuit configuration of FIG. 5 has a problem that the clock signal dividing circuits are spatially separated from the demultiplexer circuit block (D-FF and MSM-FF). This requires a great effort in design and production, so as to adjust a timing between a clock signal and a data signal.

SUMMARY OF THE INVENTION

It is therefore an object of the present invention to provide a serial-parallel conversion apparatus which facilitates a timing design between circuits.

To achieve the aforementioned object, the serial-parallel conversion apparatus according to the present invention comprises N (N=3,6,7,14 . . . ) conversion circuits, each having: a separator for dividing an input data from an upper node into a plurality of data corresponding to a plurality of terminals, according to a clock signal inputted from the upper node; and a clock generator that divides by two the aforementioned input clock signal and outputs a resultant clock as a clock signal to a lower node. These N conversion circuits are connected in a tree structure.

Thus, each separator divides a data according to a clock supplied from an immediate upper node, and a clock generator divides by two the clock signal inputted. The resultant clock signal serves as a clock signal in a conversion circuit of a lower node. Accordingly, it is possible to minimize the signal line length for transmitting the clock signal. This enables to obtain an optimal clock signal timing.

According to another aspect of the present invention, it is preferable that a separator have a first memory for fetching an input data at a first transient timing from a first level to a second level of a first clock signal and holding the data for one cycle of the clock signal; and a second memory for fetching the input data at a second transient timing from the second level to the first level of the first clock signal and holding the data for one cycle of the clock signal until a third transient timing. The first memory and the second memory are realized, for example, as flip-flop circuits.

Moreover, the clock generator includes a divider circuit for dividing the aforementioned first clock signal by two and outputting the resultant signal as a second clock signal; and a delay circuit for delaying the divided output by a predetermined period of time. By providing this delay circuit for each conversion circuit, a signal input timing to a following stage is automatically guaranteed. Thus, the circuit design is significantly simplified.

DETAILED DESCRIPTION OF THE PREFERRED EMBODIMENTS

The Description will now be directed to an embodiment of the present invention with reference to the attached drawings.

Figure 1:
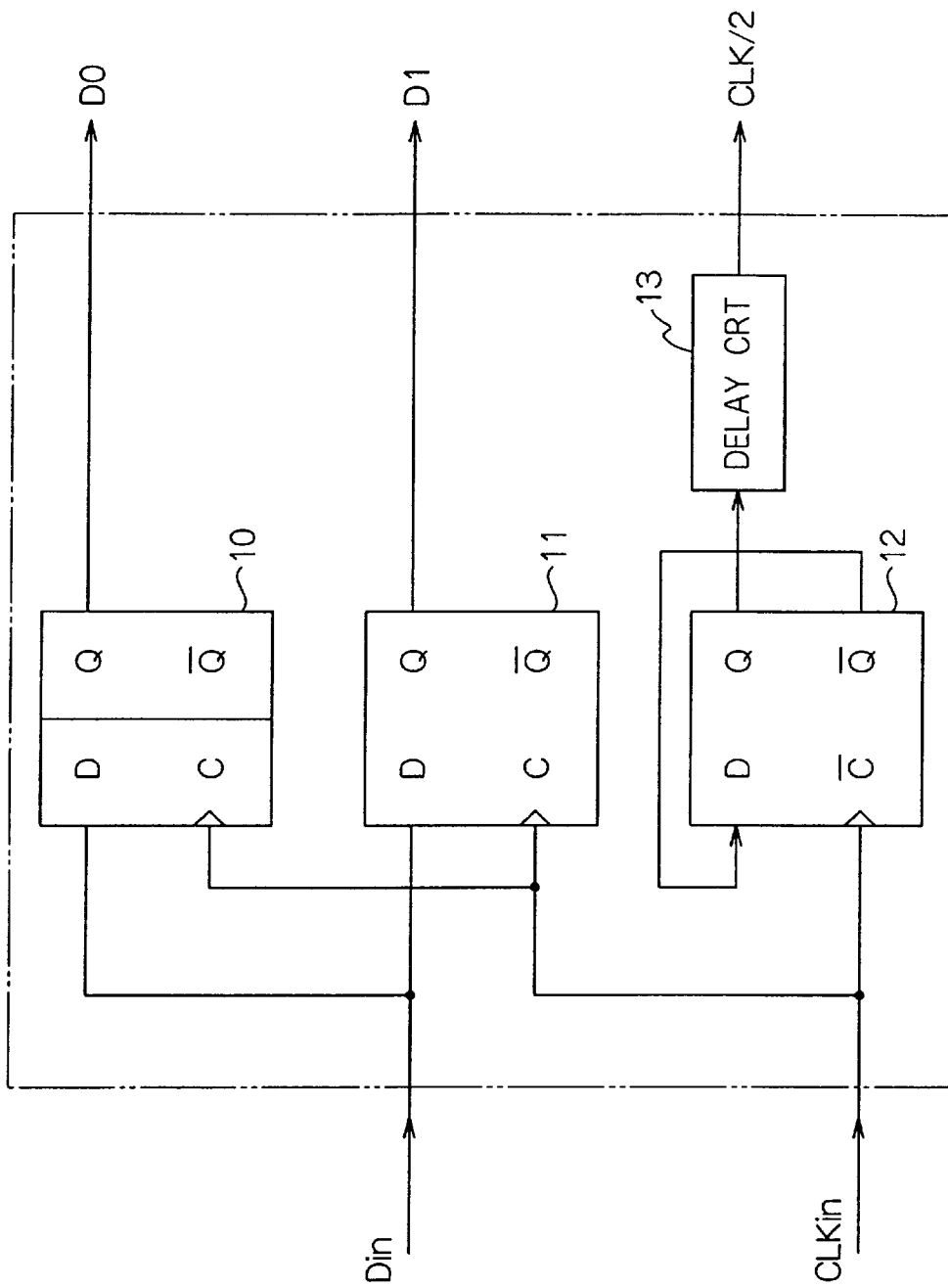
FIG. 1 is a block diagram showing a configuration of a data demultiplexer circuit according to an embodiment of the present invention.

FIG. 1 is a block diagram showing a data demultiplexer circuit according to an embodiment of the present invention, as a one-input two-output demultiplexer module. This demultiplexer module includes: an MSM-FF 10 and a D-FF 11 which are supplied with a D input as an input data; a D-FF 12 which is supplied with a reverse Q output as a D input, for dividing an input clock CLKin; and a delay circuit 13 for delaying the Q output of the D-FF 12 for timing adjustment. The MSM-FF 10 and the D-FF 11 transmit data signals D0 and D1, respectively. The delay circuit 13 transmits the input clock CLKin which has been divided by two as a CLK/2 signal.

Figure 2:
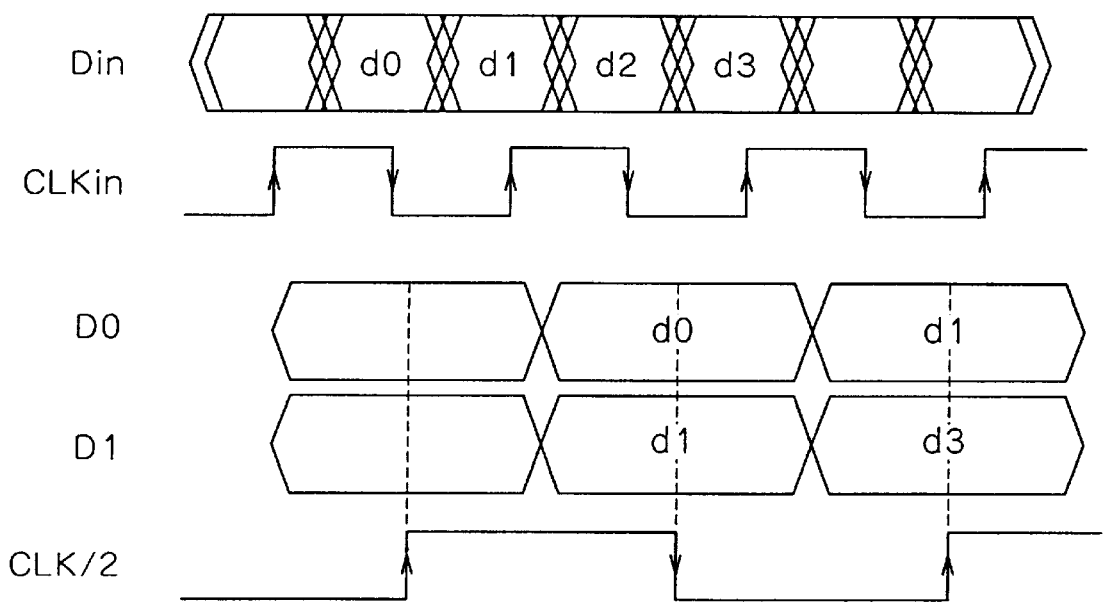
FIG. 2 is a timing chart showing an operation of the data demultiplexer circuit FIG. 1.

Explanation will now be given on the operation of the data demultiplexer circuit shown in FIG. 1, with reference to a timing chart shown in FIG. 2. In this timing chart, a data signal d0 is fetched at a clock input CLKin tail timing, and at a CLKin rise timing, the MSM-FF 10 outputs a data signal Din as a data signal d0. Moreover, at a clock input CLKin tail timings, a data signal d1 is fetched and the D-FF11 outputs the data signal Din as a data signal d1. The D-FF 12, at a clock input CLKin tail timing, divides the clock input CLKin by two and outputs a signal CLK/2.

The delay circuit 13 sets the switching timing of this CLK/2 signal approximately at the center of the period during which the data d0 and d1 are held. Accordingly, when this [1:2] demultiplexer module is connected to a following stage, the greatest timing margin can be obtained for a data fetch at this following stage without any problem. It should be noted that if a set-up hold margin has a deflection in a register circuit, the delay of the delay circuit should be set considering the deflection so as to shift the divided clock output timing.

Figure 3:
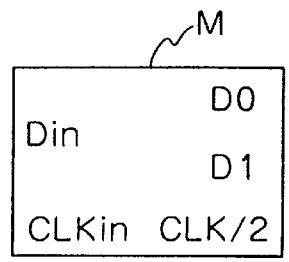
FIG. 3 shows a basic module based on a 1:2 principle according to the data demultiplexer circuit of FIG. 1.
Figure 4:
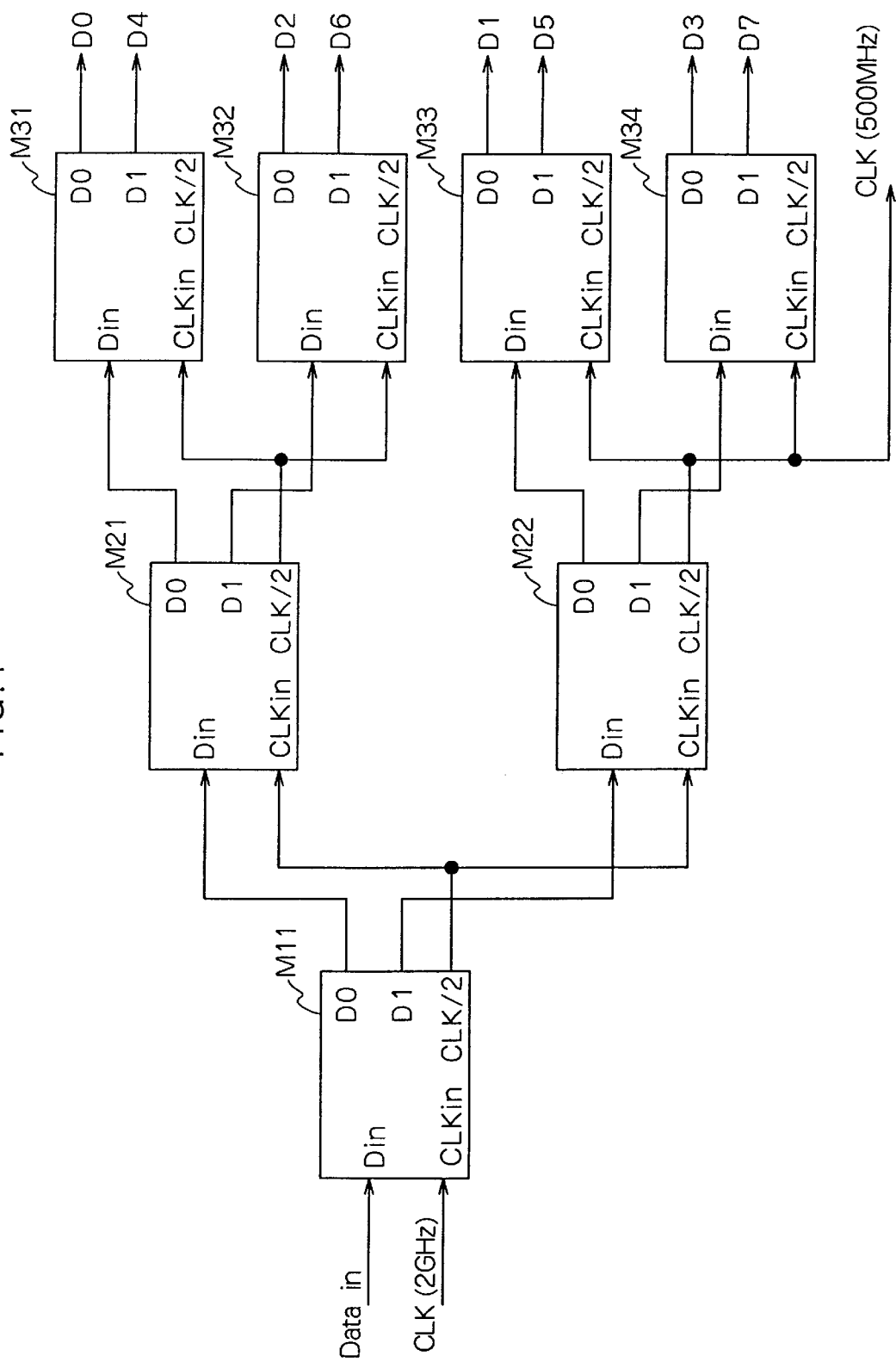
FIG. 4 shows a 1:8 demultiplexer circuit using the basic module of FIG. 3.

This [1:2] demultiplexer module having a built-in clock generating circuit for a following stage is the smallest unit, which is shown as a module M in FIG. 3. In this [1:2] demultiplexer basic module M, the data output timing and the clock signal output timing for the following stage are designed so as be matched with an optimal timing of the input data and the input clock signal to this module (securing a wide operation margin), A combination of such [1:2] basic demultiplexer modules M11, M21, M22, M31 to M34 in a tree as shown in FIG. 4 enables one to realize a demultiplexer circuit of a multi-bit output. The example of FIG. 4 is a [1:8] demultiplexer circuit using a serial input data Datain for parallel output data D0 to D7. In this case, the 2 GHz clock CLK is divided by four into 500 MHz clock CLK.

Figure 5:
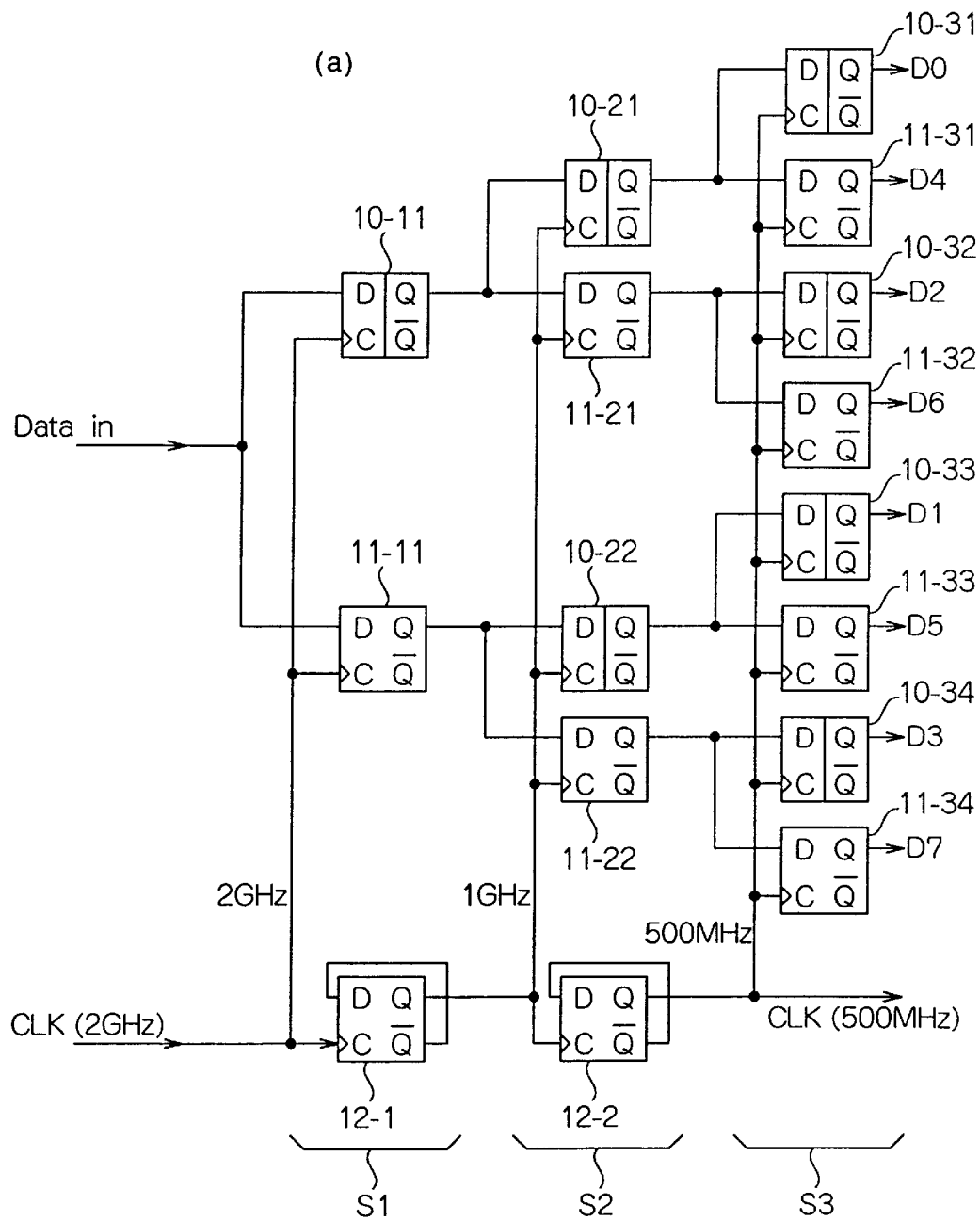
FIG. 5 is a block diagram showing a configuration of a conventional data demultiplexer circuit.
Figure 5:
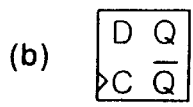
Figure 5:

In the conventional circuit shown in the aforementioned FIG. 5, the clock generating circuits are separated from the demultiplexer circuits and a global clock wiring is provided for connecting them. On the other hand, in FIG. 4, a wiring is required only for connection between modules. Moreover, the timing between a clock signal and a data signal is made optimal within each module for output. Accordingly, with a data wiring length and a clock wiring length almost identical up to the next stage, it is possible to easily operate a multiple-bit demultiplexer circuit. Furthermore, it is possible to create a multiple-bit circuit such as [1:16] and [1:32] with a simple configuration.

Thus, by combining the [1:2] demultiplexer basic module having a clock output according to the present invention, it is possible to easily design a demultiplexer circuit of a multiple-bit output.

The data demultiplexer circuit according to the present invention comprises: a flip-flop that fetches an input data at a first transient timing from a first level to a second level of a first clock signal and maintains the data for one cycle of the first clock signal before outputting it; a flip-flop that fetches an input data at a second transient timing from the second level to the first level of the first clock signal and maintains the data for one cycle of the clock signal before outputting the data at a third transient timing from the first level to the second level; and a clock generation circuit for generating a second clock signal approximately at the center of the period during which a data is maintained and outputted from both of the flip-flops. The clock generation circuit includes a divider circuit for dividing the aforementioned first clock signal by two and a delay circuit for delaying the divided output for a predetermined period of time.

Moreover, at least three of the data multiplexer circuits having the aforementioned configuration are combined in such a manner that an output of a first flip-flop of a first data demultiplexer circuit is supplied to a second data demultiplexer circuit, whereas an output of a second flip-flop of the first data demultiplexer circuit is supplied to a third data demultiplexer circuit, wherein each of the second and the third data demultiplexer circuits has first and second flip-flops that output signals in parallel, thus constituting a serial-parallel conversion circuit. That is, by combining the data demultiplexer circuit modules in tree, it is possible to constitute a serial-parallel conversion circuit with a simple timing design.

Similarly, a serial-parallel conversion circuit capable of simple timing design can be constituted by combining $2^N$ (N is a power equal to or above 2) of such data multiplexer circuits connected in a tree structure of log N (N is a logarithm using 2 as the base) stages in such a manner that outputs of the respective data demultiplexer circuits are supplied to the immediate following stages, wherein outputs of data multiplexers of the (log N)-th stage are in parallel.

The invention may be embodied in other specific forms without departing from the spirit or essential characteristic thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

The entire disclosure of Japanese Patent Application No. 09-251215 (Filed on Sep. 17, 1997) including specification, claims, drawings and summary are incorporated herein by reference in its entirety.

What is claimed is:

1. A serial-parallel conversion apparatus comprising N conversion circuits connected in a tree structure, each of said-N conversion circuits having:

a separator for dividing a data received from an upper node according to a clock signal supplied as a first clock signal from said upper node, into a plurality of data corresponding to a plurality of terminals, said separator comprising at least first and second memories, said first and second memories for fetching said data at a first and second transient timing respectively, and holding said data for one cycle of said clock signal before outputting said data; and a clock generator for dividing said clock signal and outputting said divided signal as a second clock signal for a lower node.

2. A serial-parallel conversion apparatus as claimed in claim 1, wherein said clock generator has a divider circuit for dividing by two said first clock and outputting said divided clock signal as said second clock signal.

3. A serial-parallel conversion apparatus as claimed in claim 1, wherein said clock generator has: a divider circuit for dividing by two said first clock signal; and a delay circuit for delaying output of said divided clock signal by a predetermined period of time.

4. A serial-parallel conversion apparatus as claimed in claim 2, wherein said divider circuit is a D-type flip-flop using a reverse Q output as a D input.

5. A serial-parallel conversion apparatus as claimed in claim 1, wherein said separator includes a master-slave-master type flip-flop and a D-type flip-flop.

6. A serial-parallel conversion apparatus as claimed in claim 1 further comprising a first conversion circuit and a second conversion circuit for dividing each of the data outputted from said plurality of terminals, according to said second clock signal outputted from said clock generator.

7. A serial-parallel conversion apparatus, as claimed in claim 6 further comprising:

a second clock generator in each of said first and second conversion circuits for further dividing by two said second clock signal and outputting said divided second clock signal as a third clock signal; and four additional conversion circuits of a third to a seventh conversion circuit that are respectively connected to terminals of said first and said second conversion circuits so as to further divide respective input data according to said third clock signal.

8. A serial-parallel conversion apparatus as claimed in claim 3, wherein said divider circuit is a D-type flip-flop using a reverse Q output as a D input.

9. A serial-parallel conversion apparatus comprising a plurality of conversion circuits, each of said conversion circuits comprising:

a first memory that fetches an input data at a first transient timing from a first level to a second level of a first clock signal and maintains said data for one cycle of said first clock signal;

a second memory that fetches said input data at a second transient timing from said second level to said first level of said first clock signal and maintains said data for one cycle of said first clock signal before outputting said data at a third transient timing from said first level to said second level; and a clock generator for generating a second clock signal changing its level at a timing approximately at the center of a period during which said first and said second memory maintain and output respective data, wherein said plurality of conversion circuits are $2^N$ in number (N is a power equal to, or more than 2) and connected in a tree structure having log N (log is a logarithm using 2 as the base) stages in such a manner that outputs of respective data demultiplexer circuits of the I-th stage (I is an integer from 1 to log N) are supplied to a following stage so that outputs of respective conversion circuits of the log N-th stage are in parallel.

10. A serial-parallel conversion apparatus comprising:

a first flip-flop that fetches an input data at a first transient timing from a first level to a second level of a first clock signal supplied from an upper node and maintains said data for one cycle of said first clock signal before outputting said data;

a second flip-flop that fetches an input data at a second transient timing from second level to said first level of said first clock signal and maintains said data for one cycle of said first clock signal before outputting said data; and a clock generator for generating as a clock signal for a lower node a second clock signal changing its level at a timing approximately at the center of a period during which said first and second flip-flops maintain and output respective data.

11. A serial-parallel conversion apparatus as claimed in claim 10, wherein said clock generator has a divider circuit for dividing by two said first clock signal and a delay circuit for delaying output of said divided clock signal by a predetermined period of time.

12. A conversion module for use in a serial-parallel conversion apparatus, said conversion module comprising:

a first memory that fetches an input data at a first transient timing from a first level to a second level of a first clock signal;

a second memory that fetches said input signal at a second transient timing from said second level to said first level of said first clock signal and maintains said data for one cycle of said first clock signal before outputting said data at a third transient timing from said first level to said second level; and a clock generator for generating a second clock signal changing its level at a timing approximately at the center of a period during which said first and said second memory maintain and output respective data.

13. A conversion module as claimed in claim 12, wherein said clock generator has a divider circuit for dividing by two said first clock signal and outputting said divided signal as said second clock signal.

14. A conversion module as claimed in claim 12, wherein said clock generator has a divider circuit for dividing by two said first clock signal and a delay circuit for delaying output of said divided clock signal by a predetermined period of time.

15. A conversion module as claimed in claim 13, wherein said divider circuit is a D-type flip-flop using a reverse Q output as a D input.

16. A conversion module as claimed in claim 12, wherein said first memory is a D-type flip-flop and said second memory is a master-slave-master type flip-flop.

17. A conversion module as claimed in claim 12, wherein said first level is a low level of said clock signal, and said second level is a high level of said first clock signal.

18. A conversion module as claimed in claim 14, wherein said divider circuit is a D-type flip-flop using a reverse Q output as a D input.

19. A method for dividing and outputting data comprising the steps of:

(a) fetching an input data Din at a first transient timing from a first level to a second level of a first clock signal supplied from an upper node;

(b) maintaining Din for one cycle of said first clock signal before outputting said data as data signal D0;

(c) fetching Din at a second transient timing from said second level to said first level of said first clock signal;

(d) maintaining Din for one cycle of said first clock signal before outputting said data as data signal D1;

(e) dividing said first clock signal and outputting said divided signal as a second clock signal for a lower node.

20. A method for dividing and outputting data according to claim 19, wherein said second clock signal is generated at the center of a period during which said input data is maintained and ouptut as D0 and D1.

\* \* \* \* \*